US010840068B2

(12) United States Patent
Moffat et al.

(10) Patent No.: US 10,840,068 B2
(45) Date of Patent: Nov. 17, 2020

(54) PLASMA SPREADING APPARATUS AND METHOD OF SPREADING PLASMA IN PROCESS OVENS

(71) Applicant: YIELD ENGINEERING SYSTEMS, INC., Livermore, CA (US)

(72) Inventors: William Moffat, San Jose, CA (US); Craig Walter McCoy, San Jose, CA (US)

(73) Assignee: Yield Engineering Systems, Inc., Livermore, CA (US)

( * ) Notice: Subject to any disclaimer, the term of this patent is extended or adjusted under 35 U.S.C. 154(b) by 0 days.

(21) Appl. No.: 15/898,178

(22) Filed: Feb. 15, 2018

(65) Prior Publication Data

US 2018/0308668 A1 Oct. 25, 2018

Related U.S. Application Data

(60) Provisional application No. 62/459,210, filed on Feb. 15, 2017.

(51) Int. Cl.
*H01J 37/32* (2006.01)
*H01L 21/02* (2006.01)
*H01L 21/3065* (2006.01)

(52) U.S. Cl.
CPC ...... *H01J 37/32623* (2013.01); *H01J 37/321* (2013.01); *H01J 37/32009* (2013.01); *H01J 37/3244* (2013.01); *H01J 37/32357* (2013.01); *H01J 37/32715* (2013.01); *H01J 37/32834* (2013.01); *H01L 21/02274* (2013.01); *H01L 21/3065* (2013.01); *H01J 2237/327* (2013.01); *H01J 2237/334* (2013.01); *H01J 2237/335* (2013.01); *H01J 2237/3342* (2013.01); *H01J 2237/3343* (2013.01)

(58) Field of Classification Search
None
See application file for complete search history.

(56) References Cited

U.S. PATENT DOCUMENTS

| 5,580,385 A * | 12/1996 | Paranjpe | H05H 1/46 |
| 10,083,817 B1 * | 9/2018 | Godyak | H01S 3/0975 |
| 2010/0101603 A1 * | 4/2010 | Chebi | G03F 7/427 134/1.2 |
| 2011/0073564 A1 * | 3/2011 | Nangoy | H01J 37/321 216/67 |
| 2011/0115378 A1 * | 5/2011 | Lubomirsky | H01J 37/32357 315/111.21 |
| 2015/0221479 A1 * | 8/2015 | Chen | H01L 22/26 156/345.29 |

\* cited by examiner

*Primary Examiner* — Jiong-Ping Lu
(74) *Attorney, Agent, or Firm* — Michael A. Guth (57) ABSTRACT

A device and method of spreading plasma which allows for plasma etching over a larger range of process chamber pressures. A plasma source, such as a linear inductive plasma source, may be choked to alter back pressure within the plasma source. The plasma may then be spread around a deflecting disc which spreads the plasma under a dome which then allows for very even plasma etch rates across the surface of a substrate. The apparatus may include a linear inductive plasma source above a plasma spreading portion which spreads plasma across a horizontally configured wafer or other substrate. The substrate support may include heating elements adapted to enhance the etching.

8 Claims, 7 Drawing Sheets

PLASMA SPREADING APPARATUS AND METHOD OF SPREADING PLASMA IN PROCESS OVENS

CROSS-REFERENCE TO RELATED APPLICATIONS

This application claims priority to U.S. Provisional Patent Application No. 62/459,210 to Moffat et al., filed Feb. 15, 2017, which is hereby incorporated by reference in its entirety.

FIELD OF THE INVENTION

This invention relates to plasma etching, namely a device and method for even distribution of plasma across a surface.

SUMMARY

A device and method of spreading plasma which allows for plasma etching over a larger range of process chamber pressures. A plasma source, such as a linear inductive plasma source, may be choked to alter back pressure within the plasma source. The plasma may then be spread around a deflecting disc which spreads the plasma under a dome which then allows for very even plasma etch rates across the surface of a substrate. The apparatus may include a linear inductive plasma source above a plasma spreading portion which spreads plasma across a horizontally configured wafer or other substrate. The substrate support may include heating elements adapted to enhance the etching.

DETAILED DESCRIPTION

In some embodiments of the present invention, as seen in FIGS. 1A-D, the plasma etching system 200 is comprised of plasma source 101 mounted above a process chamber 205. A main housing 204 includes the associated equipment and electronics to support the system. A wafer stack housing 202 contains substrates 203, which may be semiconductor wafers undergoing processing to become semiconductor products. A wafer moving robot 201 is adapted to insert and remove substrates 203 to and from the process chamber 205.

The plasma source 101 may be a linear-inductive plasma source. This linear-inductive plasma source may be an inductively coupled plasma source with an integrated power delivery system, producing a high density plasma that dissociates inert process gas into reactive species which flow out of the unit and perform work on substrates placed downstream. The performance of such a plasma source may be constrained in prior industrial uses, such that the chamber pressure may need to be constrained within a narrow range, or that the plasma etch rates on substrates downstream from such a source may be overly variable across a substrate.

A linear-inductive plasma source may be utilized in such a way to overcome prior deficiencies, as seen in embodiments of the present invention. As seen in cross-section in FIG. 1D, a plasma source 101 is mounted atop a lower process chamber 205. The plasma source 101 may be a linear inductive plasma source which has a cylindrical chamber within it along a vertical axis. A first zone 114 within the cylindrical chamber within the plasma source is representative of the environment within the plasma source cylindrical chamber. At the bottom of the cylindrical chamber within the plasma source is a constrictor 102 which may be a circular disc. The constrictor 102 may have an opening 116 which may be a circular opening. A spreading disc 103 resides below the opening 116 in the constrictor 102. Stand-offs 104 are used to locate the spreading disc 103 below constrictor 102 and to facilitate attachment of the spreading disc 103. The bottom surface of the spreading disc 103 may be flat and the upper surface of the spreading disc 103 may be rounded.

Figure 1A:
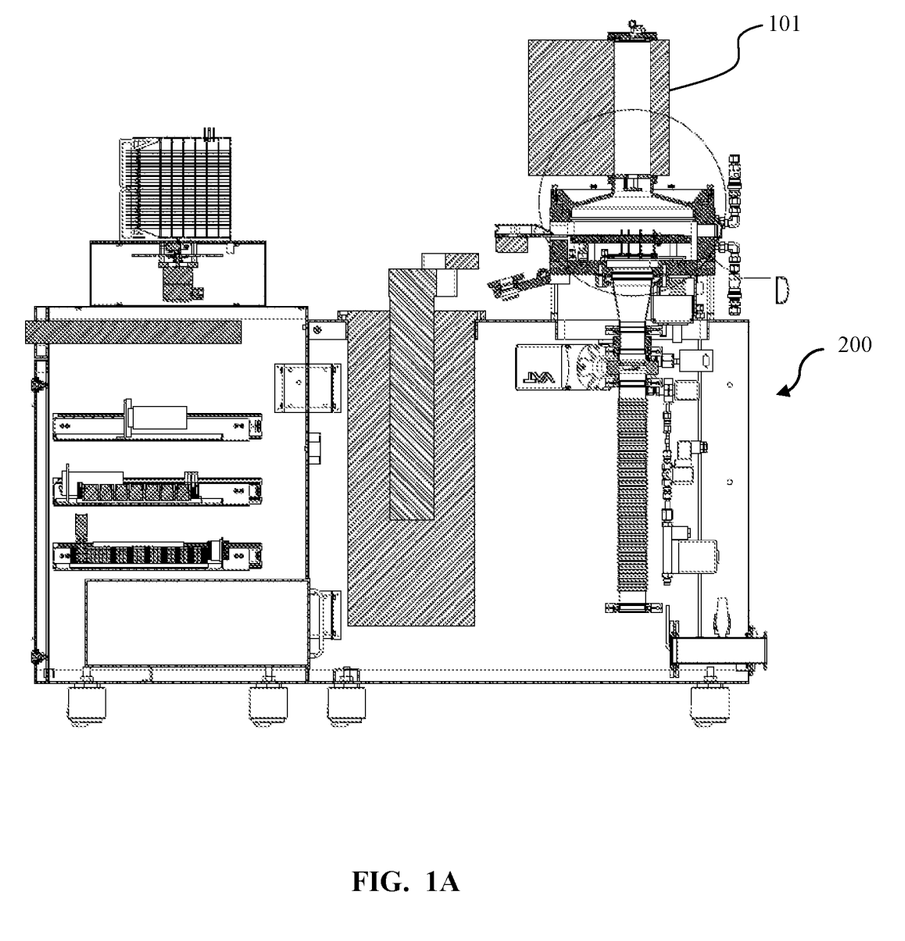
FIG. 1A is a front view with partial cross section of a system according to some embodiments of the present invention.
Figure 1B:
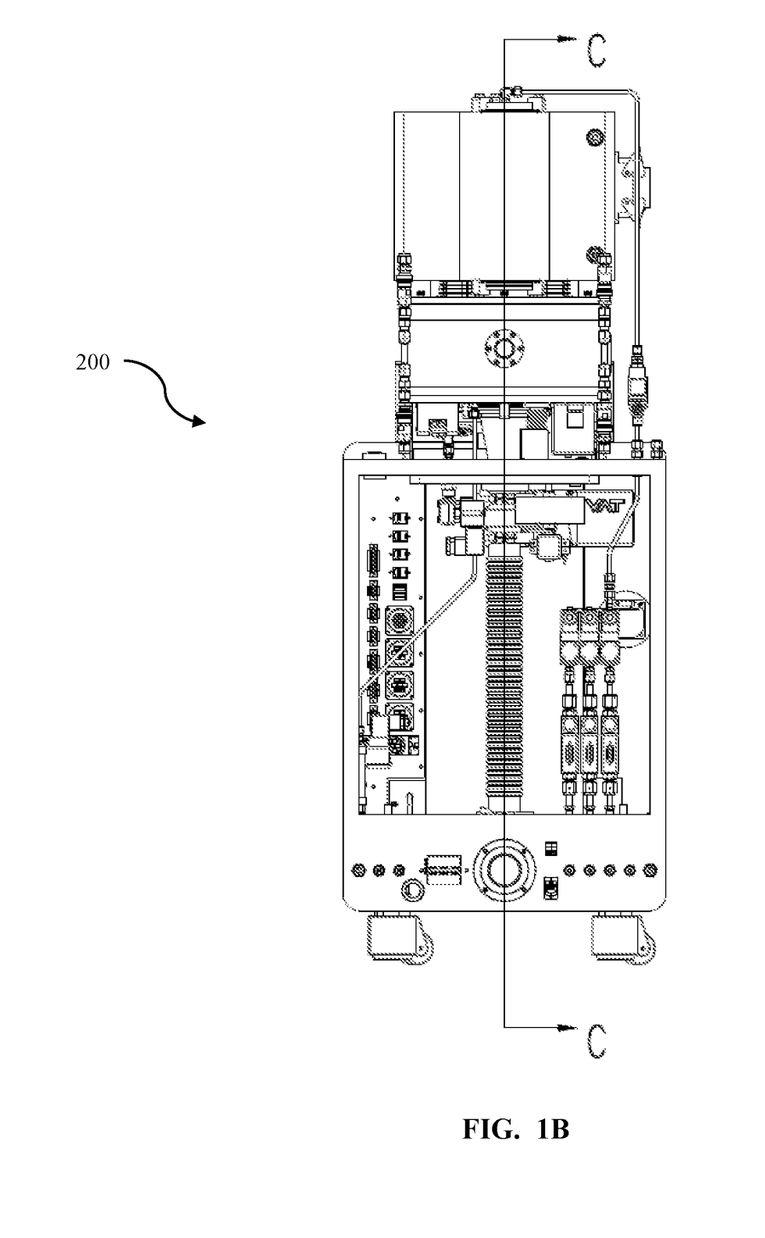
FIG. 1B is a side view of a system according to some embodiments of the present invention.
Figure 1C:
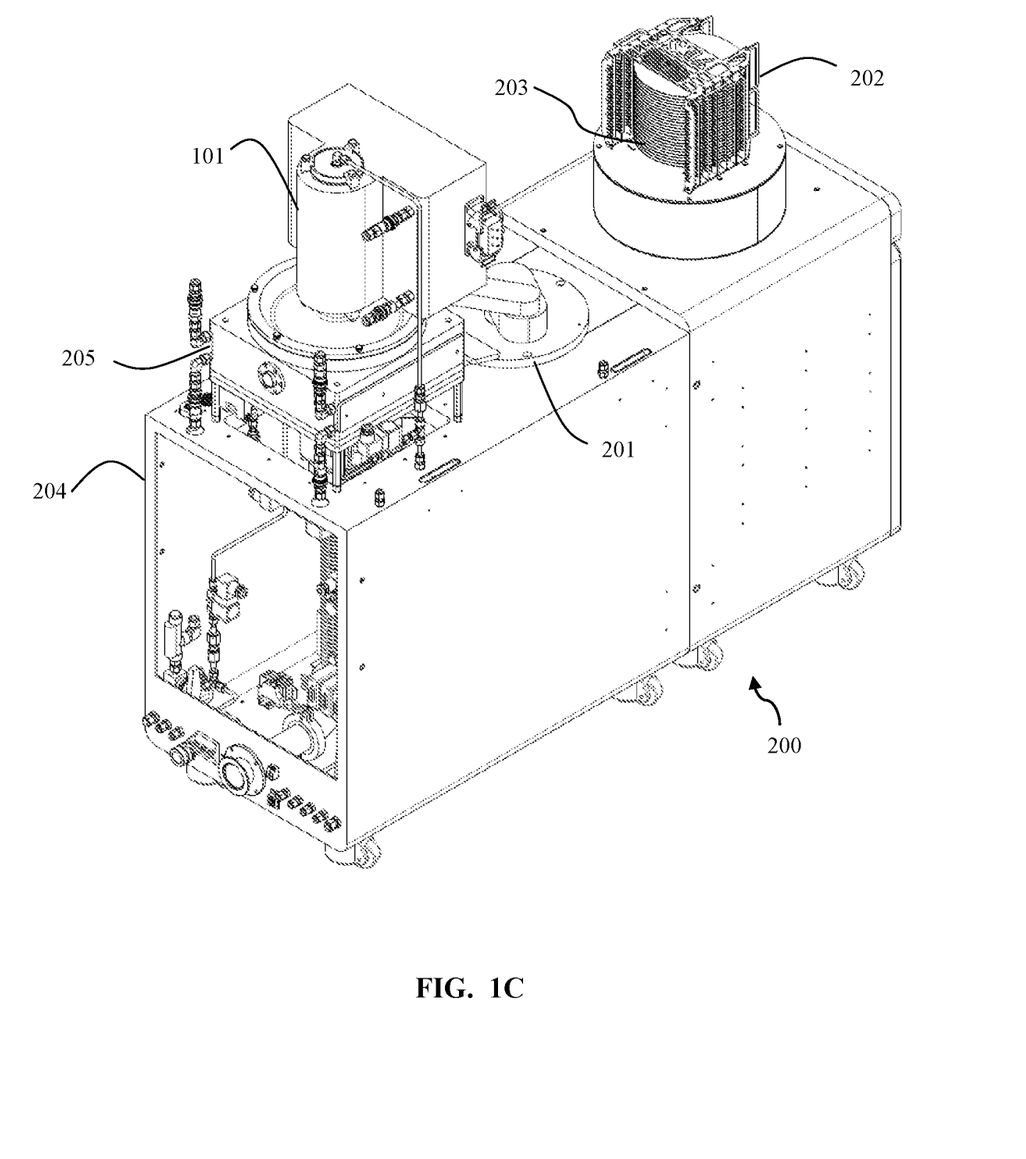
FIG. 1C is a raised perspective view of a system according to some embodiments of the present invention.
Figure 1D:
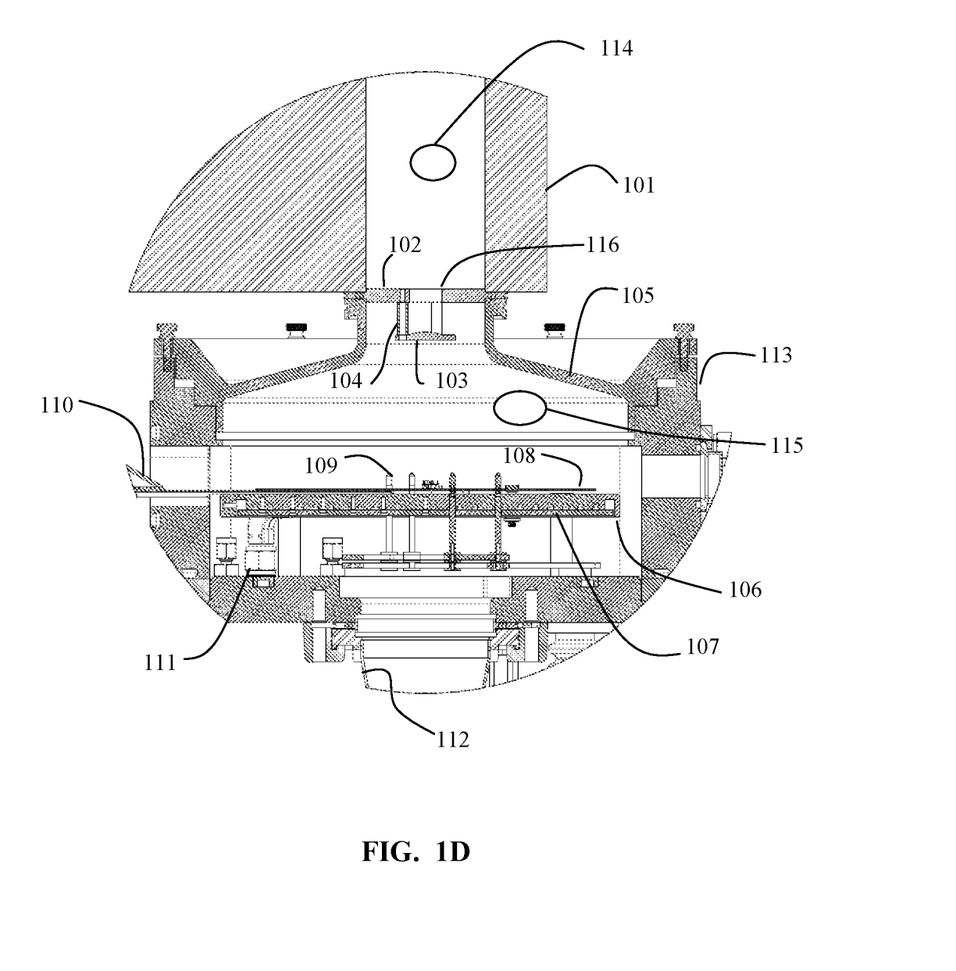
FIG. 1D is a cross sectional view of the process chamber portion of a system according to some embodiments of the present invention.

The target of a plasma process is a substrate 108, which may be a silicon wafer undergoing processing for semiconductor applications. The wafer may reside on a substrate support 106 within the lower process chamber 205. The substrate support may have an upper plate layer and a layer plate layer and have a heater element 107 routed in recesses between the two plate layers of the substrate support 106. Lift pins 109 may be used to support wafer removal. The heater element 107 may be a stainless steel clad element with electrical connection routed out of the process chamber with a heater coupling 111.

A vacuum line 112 resides below the substrate support 106 allowing for chamber exhaust at the bottom of the chamber. With the plasma input at the top of the process chamber, and then the plasma first constricted and then spread above the substrate, and then a vacuum exhaust at the bottom of the chamber, this sequence defines the flow route through the chamber.

The lower process chamber 205 has a chamber door 110 which allows for insertion and removal of the wafer 108 into the chamber housing 113. A chamber roof 105 is adapted to facilitate the flow of the plasma around the spreading disc 103 and down onto the top surface of the wafer 108. The chamber roof 105 maybe begin as a vertically aligned cylinder and then fan out as a cone to facilitate radial distribution of the plasma flow. A second zone 115 is illustrative of the environment within the process chamber 205 above the wafer 108.

In an illustrative embodiment, the plasma source 101 has an interior space cylindrical diameter of 3 inches, narrowed by the constrictor 102 with a circular opening of ¾ inches diameter. The spreading disc 103 resides below spacers 104 which are ¾ inch high. The outside diameter of the spreading disc 103 is 1 and ⅜ inches and is nominally ⅛ inch thick, with a domed top surface with a 0.78 inch radius. The bottom surface of the constrictor 102 is 3 and 15/16 above the surface of the substrate support 106. The constrictor 102, the spacers 104, and the spreading disc 103 may be of a ceramic material. An exemplary substrate 108 is a silicon wafer 8 inches in diameter and 0.030 inches thick.

With the use of a constrictor 102 a back pressure can develop in the plasma source central opening which allows the plasma to properly develop, even with the lower process chamber 205 at a different or lower pressure. For example, using the illustrative embodiment described above, a process chamber pressure of 250 mTorr to 1.2 Torr may be used during an etching process. After the plasma flows through the constrictor, the spreading disc 103 then spreads the plasma such that the surface of the wafer is very evenly etched during processing. The substrate support 106 with its heating element 107 allows for heating of the wafer, for example to 250° C., allowing for enhancement of the etching in some applications.

Figure 1E:
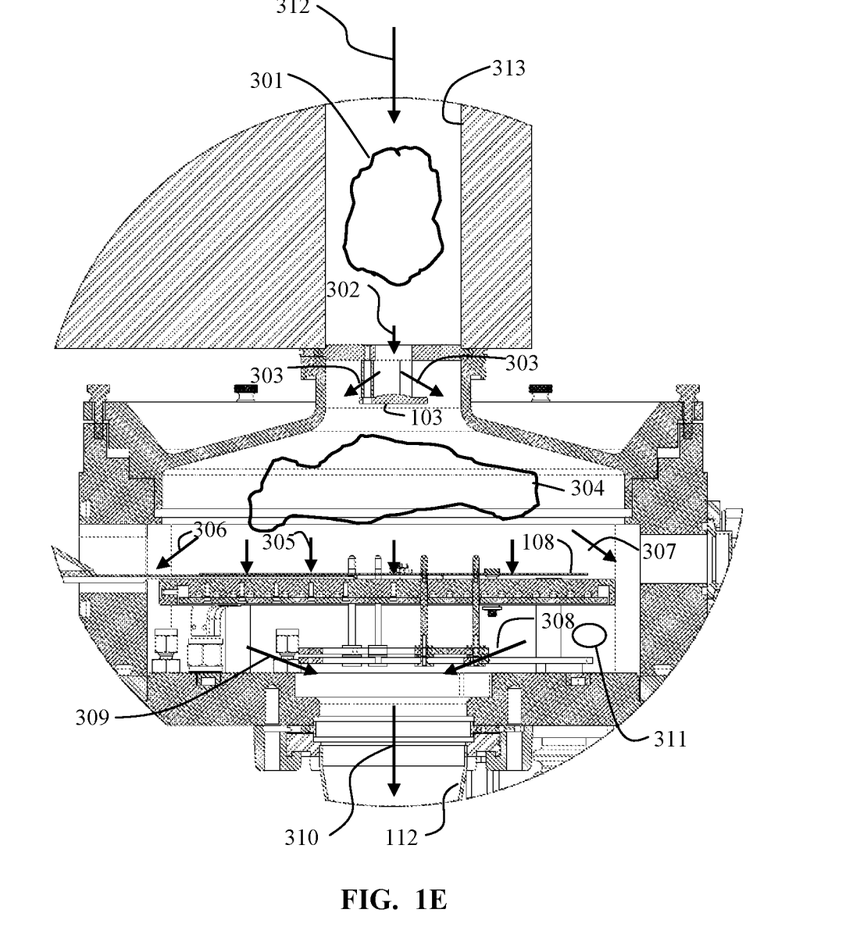
FIG. 1E is a cross sectional view of the process chamber portion of a system according to some embodiments of the present invention.

FIG. 1E further illustrates gas flow and pressure regions in some embodiments of systems and methods of the present invention. An inductive plasma source 101 has a cylindrical chamber 313 and a constrictor plate 102. The constrictor plate 102 has an opening 116. In some aspects, the plasma source 101 may be a Litmas® Remote Plasma Source 3001 by Advanced Energy of Fort Collins, Colo.

In an exemplary embodiment, gas input 312 flows into the plasma chamber 313 as a combination of O2 and N2. The O2 may flow in at a rate of 1200 sccm and N2 may also flow in concurrently at a rate of 120 sccm. The inflow gas flows into the plasma chamber 313 and may occupy a space 301 where plasma firing may occur. As there is continuous flow during a plasma process, beginning with the gas input 312 at the upper end of the plasma source 101, and ending with exit flow 310 through the vacuum exit line 112, there will be differing pressures along this flow path. In prior systems, the process efficiency, and process uniformity, may be negatively impacted due to pressure variations in the process chamber. These pressure variations may be due to a variety of factors, such as vacuum pump stability, aspects of the vacuum throttle valve, the gas distribution itself, accuracies of sensors, and other factors.

Using a chamber pressure point 311 as a guidepost for chamber pressure measurement, to achieve plasma firing in the firing space 301 the chamber pressure point may be needed to be kept within a 100 mTorr range, which may be 800-900 mTorr. In some systems the factors listed above which may lead to pressure variations may make it difficult to remain within such a tight pressure range. Excursions outside the pressure range may lead to incomplete plasma firing, or the cessation of firing. Process efficiency may be significantly lower when suffering from these effects. When using a ¾ inch inside diameter 116 constrictor 102 with the 3 inch cylinder 313 at the flow rates listed above, full firing in the firing space 301 may occur over a range of pressure difference an order of magnitude higher, from 250 mTorr to 1.2 Torr, for example. Without a constrictor there may not be full, or any, plasma firing in such a configuration. With too much of a constriction, plasma efficiency may also be impacted.

In some aspects, the interior diameter of the plasma chamber 313 is 3 inches. In some aspects, the interior diameter 116 of the constrictor 102 is ¾ inch. In some aspects, the interior diameter 116 of the constrictor 102 is in the range of ⅜ inch to 1 inch. In some aspects, the interior diameter 116 of the constrictor 102 is in the range of ⅜ inch to 1.25 inches. In some aspects, the interior diameter 116 of the constrictor 102 is in the range of ⅛ of the diameter of the interior diameter of the plasma chamber 313 to ⅓ of the interior diameter of the plasma chamber. In some aspects, the interior diameter of the plasma chamber 313 is in the range of 2 to 4 inches.

As the plasma flows through 302 the interior annulus 116 of the constrictor 102, the flow is moderated by the spreading disc 103. The flow is routed 303 outwards around the spreading disc 103. The plasma then resides within a central zone 304 within the chamber 205 constrained from above by the chamber roof 105. The plasma works downward 305 on the top surface of the substrate 108. Another advantage of systems according to embodiments of the present invention is that there is more even plasma distribution onto the top surface of the substrate 108. In some aspects, the etch rate uniformity is within 6%. In some aspects, the uniformity is within 10%. Exemplary data is seen in Table 1.

TABLE 1

| Resist Thickness | Wafer Size | Temp | Pressure | RF Power | O2 Flow | N2 Flow | Total Time | Rate | *Unif |
|---|---|---|---|---|---|---|---|---|---|
| 4μ | 150 mm | 200 C. | 370 mTorr | 3 kW | 1200 sccm | 120 sscm | 30 sec | 5.03 μ/min | 4.50% |
| 4μ | 150 mm | 200 C. | 370 mTorr | 3 kW | 1200 sccm | 120 sccm | 30 sec | 5.18 μ/min | 5.90% |
| 4μ | 150 mm | 200 C. | 370 mTorr | 3 kW | 1200 sccm | 120 sccm | 30 sec | 5.22 μ/min | 3.60% |
| 4μ | 150 mm | 200 C. | 370 mTorr | 3 kW | 1200 sccm | 120 sccm | 30 sec | 5.29 μ/min | 4.30% |
| 4μ | 150 mm | 200 C. | 370 mTorr | 3 kW | 1200 sccm | 120 sccm | 30 sec | 5.28 μ/min | 3.90% |

*Unif. = (Max − Min.)/2 Mean × 100

As the plasma and/or gasses flow past the central zone 304 it routes 306, 307 around the exterior of the substrate 108. The gas flow continues 308, 309 and then the exit flow 310 then routes out of the chamber. As discussed above, the use of a constrictor plate and the beam spreader results in processing with the combined advantages of maintaining plasma, and plasma efficiency, over a wider range of chamber pressure variations and also results in a more uniform processing of the substrate.

Figure 2A:
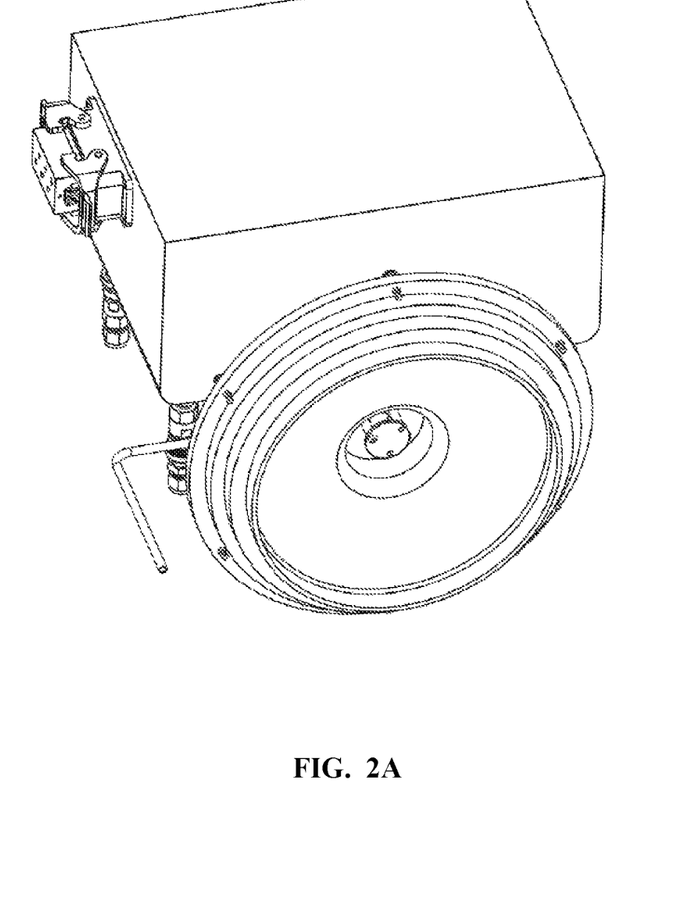
FIG. 2A is a view of the plasma source and beam spreading portion according to some embodiments of the present invention.
Figure 2B:
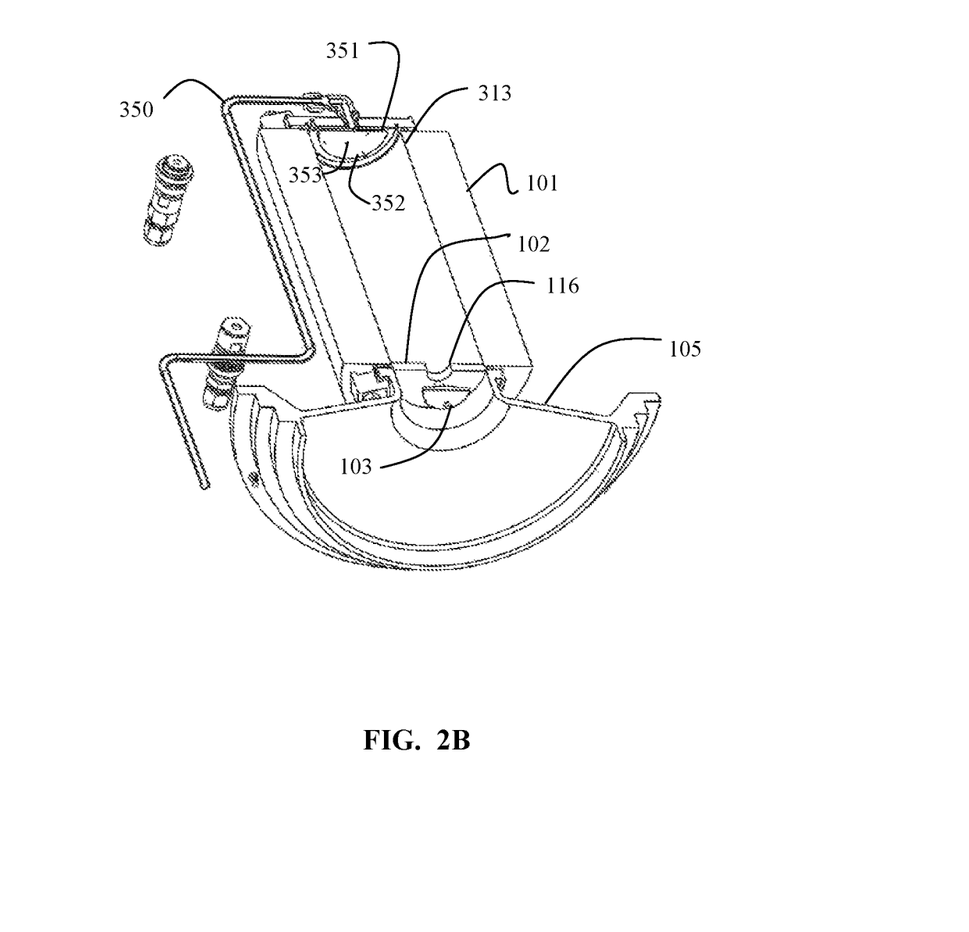
FIG. 2B is a cross sectional view of the plasma source and beam spreading portion according to some embodiments of the present invention.

In some embodiments of the present invention, as seen in FIGS. 2A and 2B, the system is also moderated by a gas input showerhead 351. A gas inlet line 350 may supply the process gasses, which may O2 and N2, for example, as discussed above. The gas routes into a gas input showerhead 351, which spreads the gas flow over the circular area at the upper end of the plasma chamber 313 of the plasma source 101. The gas input showerhead 351 may have a disc 352 with gas exit holes 353 arranged around the bottom surface of the disc 352. The gas exit holes 353 may be sized such that there is some flow resistance within the gas flow as it exits through the gas exit holes 353, evening out the gas flow through the different gas exit holes. With the moderated, even, gas input at the input end of the plasma source 101, which may be a linear-inductive plasma source, and the moderated gas exit through the interior 116 of the constrictor 102, very high plasma efficiency may be obtained. Coupled with the gas spreading disc 103 under the conical chamber top 105, the system then facilitates extremely even plasma processing on a substrate, as discussed above, and as seen in Table 1.

As evident from the above description, a wide variety of embodiments may be configured from the description given herein and additional advantages and modifications will readily occur to those skilled in the art. The invention in its broader aspects is, therefore, not limited to the specific details and illustrative examples shown and described. Accordingly, departures from such details may be made without departing from the spirit or scope of the applicant's general invention.

What is claimed is:

1. A method for plasma processing, said method comprising the steps of:
   flowing process gas into a plasma source at a first end of said plasma source, wherein said plasma source is a linear-inductive plasma source with a cylindrical plasma chamber, said plasma source located above a substrate support;
   constricting the flow of the plasma as it exits the plasma source through a central exit hole of a constricting disc, said constricting disc at a second end of said plasma source, a center of said central exit hole of a center of said constricting disc, said center of said constricting disc centrally located over a center of said substrate support; and
   spreading the flow of the plasma after constricting the flow of the plasma, wherein the step of spreading the flow of the plasma comprises flowing the plasma around the outside circumference of a solid spreading disc located downstream from the central exit hole, said solid spreading disc coupled to said constricting disc, thereby distributing the plasma onto a substrate below the spreading.

2. The method of claim 1 wherein the step of flowing process gas into a plasma source comprises flowing the gas through a gas input showerhead at said first end of said plasma source.

3. The method of claim 2 wherein the step of constricting the flow of the plasma comprises flowing the gas through an annulus of a constricting disc, said annulus at the center of said constricting disc.

4. The method of claim 2 wherein the ratio of the diameter of the annulus in the constrictor plate to the interior diameter of the cylindrical plasma chamber is in the range of 1:8 to 1:3.

5. The method of claim 4 wherein the diameter of the spreading disc is larger than the diameter of the annulus in the constrictor plate.

6. The method of claim 1 wherein the step of constricting the flow of the plasma comprises flowing the gas through an annulus of a constricting disc, said annulus at the center of said constricting disc.

7. The method of claim 1 wherein the ratio of the diameter of the annulus in the constrictor plate to the interior diameter of the cylindrical plasma chamber is in the range of 1:8 to 1:3.

8. The method of claim 7 wherein the diameter of the spreading disc is larger than the diameter of the annulus in the constrictor plate.

* * * * *